(12) United States Patent
Gu et al.

(10) Patent No.: US 11,817,142 B2
(45) Date of Patent: Nov. 14, 2023

(54) REFRESH CIRCUIT AND MEMORY

(71) Applicant: CHANGXIN MEMORY TECHNOLOGIES, INC., Hefei (CN)

(72) Inventors: Yinchuan Gu, Hefei (CN); Geyan Liu, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 154 days.

(21) Appl. No.: 17/480,342

(22) Filed: Sep. 21, 2021

(65) Prior Publication Data

US 2022/0246191 A1 Aug. 4, 2022

Related U.S. Application Data

(63) Continuation of application No. PCT/CN2021/106730, filed on Jul. 16, 2021.

(30) Foreign Application Priority Data

Jan. 29, 2021 (CN) .......................... 202110126316.5

(51) Int. Cl.
*G11C 11/406* (2006.01)
*G11C 11/4076* (2006.01)
(Continued)

(52) U.S. Cl.
CPC .......... *G11C 11/406* (2013.01); *G11C 11/408* (2013.01); *G11C 11/4076* (2013.01); *H03K 19/20* (2013.01)

(58) Field of Classification Search
CPC .. G11C 11/406; G11C 11/4076; G11C 11/408
See application file for complete search history.

(56) References Cited

U.S. PATENT DOCUMENTS 9,490,004 B2* 11/2016 Jeong ................ G11C 11/40626
2006/0023545 A1* 2/2006 Ito ........................ G11C 11/406
365/222
(Continued)

FOREIGN PATENT DOCUMENTS

CN 101432817 B 5/2009
CN 102655022 A 9/2012
(Continued)

OTHER PUBLICATIONS

International Search Report as cited in PCT/CN2021/109273 dated Oct. 26, 2021, 9 pages.
(Continued)

*Primary Examiner* — Min Huang
(74) *Attorney, Agent, or Firm* — Cooper Legal Group, LLC

(57) ABSTRACT

Embodiments of the present application provide a refresh circuit and a memory. The refresh circuit includes: a refresh control module configured to receive and execute a refresh command to output a row address refresh signal; and further configured to receive a process corner signal to adjust an execution proportion of the refresh command, the faster a process corner represented by the process corner signal, the higher the adjusted execution proportion; a row addresser configured to receive the row address refresh signal and output a to-be-refreshed single-row address; and an array refresh device configured to perform a single-row refresh operation according to the single-row address and output a single-row refresh end signal after the end of single-row refresh. The embodiments of the present application help reduce the consumption of refresh currents.

14 Claims, 3 Drawing Sheets

(51) Int. Cl.
  *G11C 11/408* (2006.01)
  *H03K 19/20* (2006.01)

(56) References Cited

U.S. PATENT DOCUMENTS

| | | |
|---|---|---|
| 2006/0132516 A1 | 6/2006 | Walmsley et al. |
| 2007/0033338 A1* | 2/2007 | Tsern ............... G11C 29/50016 |
| | | 711/106 |
| 2010/0246299 A1* | 9/2010 | Iwai ....................... G11C 29/84 |
| | | 365/194 |
| 2012/0039133 A1 | 2/2012 | Kadowaki |
| 2012/0170396 A1 | 7/2012 | Kim |
| 2013/0111296 A1* | 5/2013 | Jung .................. G06F 11/1048 |
| | | 714/755 |

FOREIGN PATENT DOCUMENTS

| | | |
|---|---|---|
| CN | 103578526 A | 2/2014 |
| CN | 107068174 A | 8/2017 |
| CN | 107463724 A | 12/2017 |
| CN | 107578792 A | 1/2018 |
| CN | 109949844 A | 6/2019 |
| CN | 112837727 A | 5/2021 |

OTHER PUBLICATIONS

International Search Report as cited in PCT/CN2021/106730 dated Nov. 1, 2021, 10 pages.

* cited by examiner

REFRESH CIRCUIT AND MEMORY

CROSS-REFERENCE TO RELATED APPLICATIONS

This application is a continuation application of International Patent Application No. PCT/CN2021/106730, filed on Jul. 16, 2021, which claims priority to Chinese Patent Application No. 202110126316.5, filed with the Chinese Patent Office on Jan. 29, 2021 and entitled "REFRESH CIRCUIT AND MEMORY." International Patent Application No. PCT/CN2021/106730 and Chinese Patent Application No. 202110126316.5 are incorporated herein by reference in their entireties.

TECHNICAL FIELD

Embodiments of the present application relate to the field of semiconductors, and in particular, to a refresh circuit and a memory.

BACKGROUND

In order to preserve data in a volatile memory, a refresh operation is required to be performed on the volatile memory periodically. The refresh operation is required to refresh all rows within a data hold time. The data hold time of the volatile memory is related to a type of a chip process corner. The data hold time is shorter under a faster process corner, and longer under a slower process corner.

In a conventional art, based on a standard of meeting a faster process corner, a refresh command is sent at a corresponding time interval is sent according to a data hold time corresponding to the faster process corner. A fixed number of rows are refreshed under each refresh command, and all row addresses are refreshed within a corresponding shorter data hold time. Therefore, under a normal process corner or a slower process corner, all the row addresses may be refreshed in advance within a corresponding longer data hold time, but the refresh command may still be sent according to a fixed time interval. In this case, refresh may start from Row 0 again, but this part is an unnecessary refresh within the data hold time, which wastes currents.

SUMMARY

The embodiments of the present application provide a refresh circuit and a memory, which help reduce the consumption of refresh currents.

The embodiments of the present application provide a refresh circuit, including: a refresh control module configured to receive and execute a refresh command to output a row address refresh signal; and further configured to receive a process corner signal to adjust an execution proportion of the refresh command, the faster a process corner represented by the process corner signal, the higher the adjusted execution proportion; a row addresser configured to receive the row address refresh signal and output a to-be-refreshed single-row address; and an array refresh device configured to perform a single-row refresh operation according to the single-row address and output a single-row refresh end signal after the end of single-row refresh.

Correspondingly, the embodiments of the present application further provide a memory, including the refresh circuit according to any one of the above items.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

In order to make the objectives, technical solutions and advantages of the embodiments of the present application clearer, various embodiments of the present application will be described below in detail with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

Figure 1:
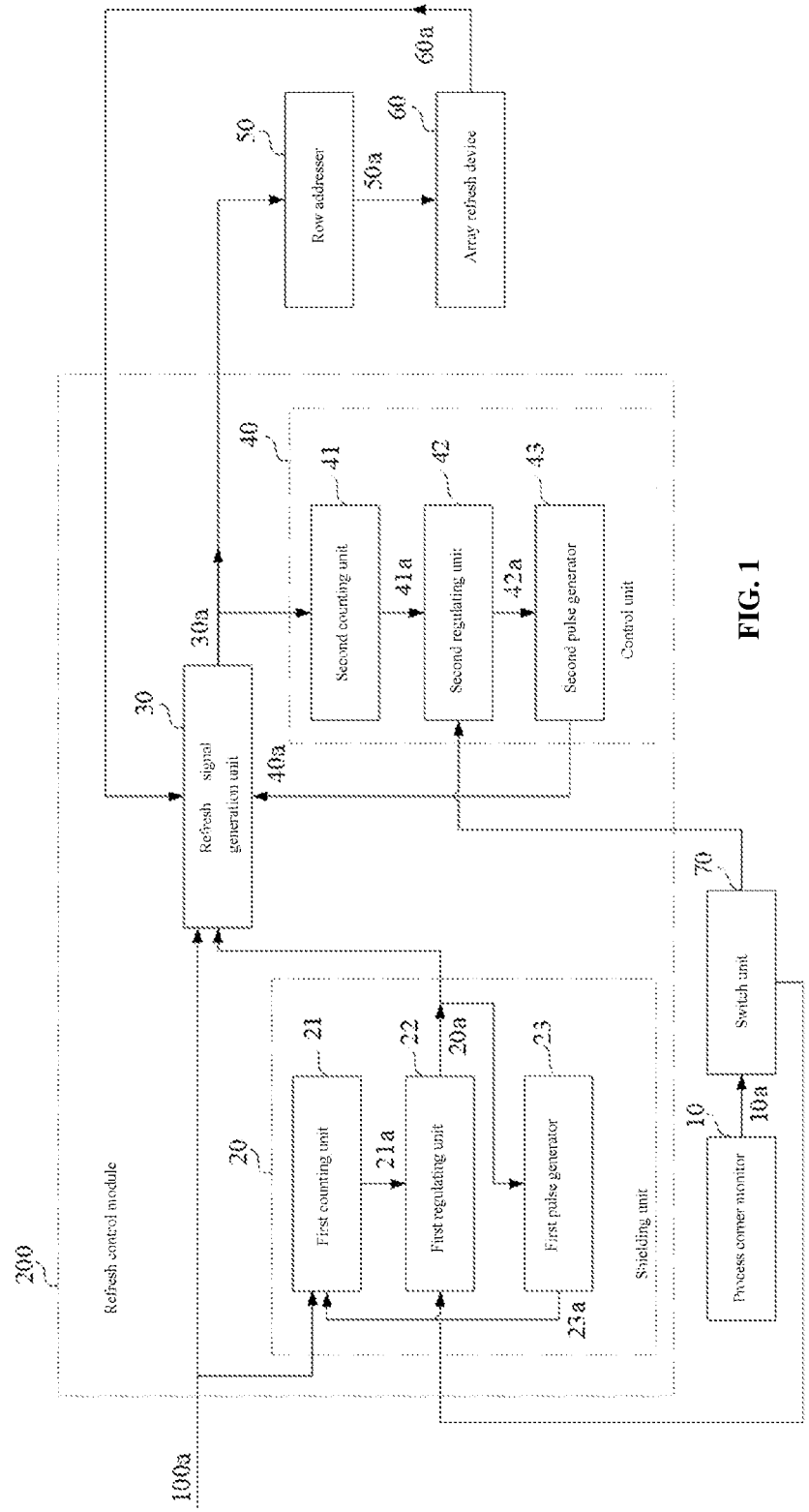
FIG. 1 and FIG. 2 are schematic structural diagrams of a refresh circuit according to an embodiment of the present application.

Referring to FIG. 1, a refresh circuit includes: a refresh control module 200 configured to receive and execute a refresh command 100a to output a row address refresh signal 30a; and further configured to receive a process corner signal 10a to adjust an execution proportion of the refresh command 100a, the faster a process corner represented by the process corner signal 10a, the higher the adjusted execution proportion; a row addresser 50 configured to receive the row address refresh signal 30a and output a to-be-refreshed single-row address 50a; and an array refresh device 60 configured to perform a single-row refresh operation according to the single-row address 50a and output a single-row refresh end signal 60a after the end of single-row refresh.

Each time the row addresser 50 receives a row address refresh signal 30a, it outputs a to-be-refreshed single-row address 50a. The single-row address 50a corresponds to each row of an array in the array refresh device 60. Each time a row address refresh signal 30a is received, address information included in the single-row address 50a is increases by 1; that is, the address information is increased successively according to an order of Row 0, Row 1 and Row 2, until all row addresses are sent. Correspondingly, the array refresh device 60 performs refresh row by row based on the received single-row address 50a, and when the row addresser 50 sends all the row addresses, the array refresh device 60 refreshes all the rows correspondingly. It is to be noted that, if the row addresser 50 continuously receives the row address refresh signal 30a after sending all the row addresses, all the row addresses are sent again according to an order of Row 0, Row 1, Row 2 . . . .

In this embodiment, the refresh control module 200 includes: a shielding unit 20 configured to receive the refresh command 100a and the process corner signal 10a and output a shielding signal 20a; and further configured to count the refresh command 100a to acquire a first count value, and output the shielding signal 20a when the first count value is equal to a shielding value, the shielding signal 20a being configured to shield the refresh command 100a; and a refresh signal generation unit 30 configured to receive the shielding signal 20a and the refresh command 100a and output the row address refresh signal 30a; output the row address refresh signal 30a when receiving the refresh command 100a but not receiving the shielding signal 20a, and suspend outputting the row address refresh signal 30a when receiving the shielding signal 20a. In this way, a shielding proportion and an execution proportion of the refresh command 100a may be adjusted by adjusting a size of the shielding value. The shielding proportion and the execution proportion are complementary to each other. Assuming that the shielding value is n, the shielding proportion is 1/n and the execution proportion is n−1/n, where n is a natural number greater than 1.

Specifically, the shielding unit 20 includes: a first regulating unit 22 configured to receive a marking signal 21a and the process corner signal 10a and output the shielding signal 20a; and configured to determine the shielding value according to the process corner signal 10a, and output the shielding signal 20a when receiving the marking signal 21a and the process corner signal 10a at the same time; and a first counting unit 21 configured to receive the refresh command 100a and count the received refresh command 100a, and output the marking signal 21a when the first count value is equal to the shielding value; and further configured to receive a shielding reset signal 23a, reset the first count value when receiving the shielding reset signal 23a, and suspend outputting the marking signal 21a. The determination of the shielding value follows a principle that the faster the process corner, the greater the shielding value, so as to ensure that the refresh command 100a has a higher execution proportion under a faster process corner, ensure that all row addresses can be refreshed in time, and ensure that the refresh command 100a has a lower execution proportion under a slower process corner, thereby preventing a waste of refresh currents.

Further, the first counting unit 21 includes a first counter 211 and a second counter 212, a shielding value of the first counter 211 being less than that of the second counter 212; and the first regulating unit 22 includes a first OR gate 224, a first AND gate 221 and a second AND gate 222, an input terminal of the first OR gate 224 being connected to output terminals of the first AND gate 221 and the second AND gate 222, and an output terminal of the first OR gate 224 acting as an output terminal of the first regulating unit 22; and the first AND gate 221 is configured to receive the marking signal 21a outputted by the first counter 211, and configured to receive a first process corner signal C1; the second AND gate 222 is configured to receive the marking signal 21a outputted by the second counter 212, and configured to receive a second process corner signal C2, a process corner represented by the second process corner signal C2 being faster than that represented by the first process corner signal C1.

In this embodiment, the first counting unit 21 further includes: a third counter 213, a shielding value of the third counter 213 being greater than that of the second counter 212; and the first regulating unit 22 further includes: a third AND gate 223, the third AND gate 223 being configured to receive the marking signal 21a outputted by the third counter 213, and configured to receive a third process corner signal C3, a process corner represented by the third process corner signal C3 being faster than that represented by the second process corner signal C2, and an output terminal of the third AND gate 223 being connected to the input terminal of the first OR gate 224.

Specifically, the first process corner signal C1 represents a slower SS process corner, and the shielding value of the first counter 211 is 8; the second process corner signal C2 represents a normal TT process corner, and the shielding value of the second counter 212 is 16; the third process corner signal C3 represents a faster FF process corner, and the shielding value of the third counter 213 is 32. In other embodiments, the process corner signal is further configured to represent an FS process corner and an SF process corner. Different process corners correspond to different shielding values. The faster the process corner represented by the process corner signal 10a, the greater the shielding value in the corresponding counter, and the higher the execution proportion of the refresh command 100a; then all the row addresses are refreshed within a shorter data hold time.

In this embodiment, each AND gate is configured to receive a specific process corner signal 10a, and different AND gates receive different process corner signals 10a. Therefore, when the first regulating unit 22 receives the process corner signal 10a, an AND gate for receiving can be determined according to a type of the process corner signal 10a, and then a counter corresponding to the process corner signal 10a is determined, so as to determine a shielding value in the counter as an actually executed shielding value.

In this embodiment, the shielding unit 20 further includes: a first pulse generator 23 configured to receive the shielding signal 20a and output the shielding reset signal 23a; and a first delay unit 24 configured to delay the shielding reset signal 23a, a delay time being greater than one clock cycle. After receiving the shielding reset signal 23a, the first counting unit 21 resets the first count value, and suspends outputting the marking signal 21a. When the marking signal 21a is suspended, the shielding signal 20a is correspondingly suspended. Therefore, it may be considered that a delay time of the shielding reset signal 23a determines a duration of the shielding signal 20a.

In this way, the duration of the shielding signal 20a may be controlled by adjusting parameters of the first delay unit 24 to ensure that the duration of the shielding signal 20a is greater than one clock cycle or greater than a duration of the refresh command 100a and ensure that the duration of the shielding signal 20a is greater than the duration of the refresh command 100a, so as to effectively shield the refresh command 100a and reduce the waste of refresh currents.

In this embodiment, the refresh circuit further includes: a second delay unit 101 configured to match delays of the first counting unit 21 and the first regulating unit 22 to enable the shielding signal 20a to reach the refresh signal generation unit 30 earlier than the refresh command 100a, which ensures effective shielding of the shielding signal 20a. In addition, the refresh circuit further includes: a process corner monitor 10 configured to monitor a process corner of a target chip, and output a specific process corner signal 10a according to the process corner.

In this embodiment, the first regulating unit 22 further includes a first fuse unit (not shown) connected to the first AND gate 221, a second fuse unit (not shown) connected to the second AND gate 222 and a third fuse unit (not shown) connected to the third AND gate 223. The first regulating unit 22 receives the first process corner signal C1 through the first fuse unit, receives the second process corner signal C2 through the second fuse unit, and receives the third process corner signal C3 through the third fuse unit. When the process corner of the target chip monitored by the process corner monitor 10 is the first process corner signal C1 representing the SS process corner, the second fuse unit and the third fuse unit may be fused, so that an input terminal of the second AND gate 222 and the third AND gate 223 is at a low level, and only the first fuse unit is retained to receive the first process corner signal C1. In this case, it may be considered that the first fuse unit stores process corner information.

A partial operation principle of the refresh circuit is described below with reference to the timing diagram of signal generation of the refresh circuit provided in FIG. 3 with an example in which the first process corner signal C1 representing the SS process corner is received and the refresh command 100a has an execution proportion of 7/8 and a shielding proportion of 1/8.

It is to be noted that a manner in which a specific signal between different functional structures is active is not particularly limited in the present application. The specific signal may be active-high or active-low, or rising-edge or falling-edge active. In this embodiment, the refresh command 100a is an active-high pulse signal, the shielding reset signal 23a, the row address refresh signal 30a and the single-row refresh end signal 60a are active-high pulse signals, and the process corner signal 10a, the marking signal 21a and the shielding signal 20a are active-high signals.

Figure 3:
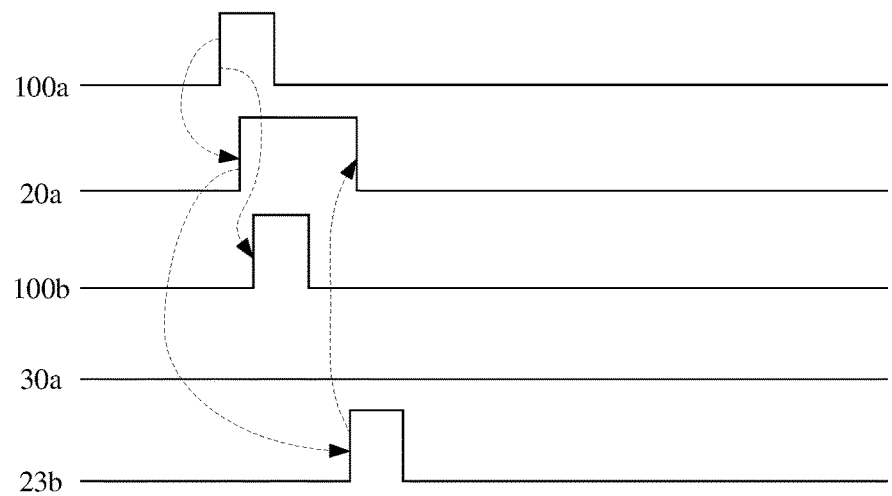
FIG. 3 and FIG. 4 are timing diagrams of signal generation of the refresh circuit according to an embodiment of the present application.

In addition, a dashed line with an arrow in FIG. 3 refers to a causal relationship of signal generation. A start point of the arrow is Cause and an end point is Effect. Moreover, the refresh command 100a is an eighth refresh command 100a received by the first counter 211.

Specifically, when the first counter 211 receives the eighth refresh command 100a, since the first count value is equal to the shielding value of the first counter 211, the first counter 211 outputs the marking signal 21a, the first AND gate 221 outputs a high-level signal, the first OR gate 224 outputs an active-high shielding signal 20a, the first pulse generator 23 receives the shielding signal 20a and generates the shielding reset signal 23a, the first delay unit 24 delays the shielding reset signal 23a and outputs a delayed shielding reset signal 23b, and the first counter 211, after receiving the delayed shielding reset signal 23b, resets the first count value, that is, zeros the first count value, and suspends outputting the marking signal 21a, so as to suspend the shielding signal 20a.

The second delay unit 101 receives the refresh command 100a and outputs a delayed refresh command 100b to match delays of the first counting unit 21 and the first regulating unit 22, specifically to match delays of the first counter 211, the first AND gate 221 and the first OR gate 224, which ensures that the delayed refresh command 100b reaches the refresh signal generation unit 30 later than the shielding signal 20a, and accurately reaches a second NOR gate 313 later than the shielding signal 20a, so that the shielding signal 20a can effectively shield the delayed refresh command 100b, thereby preventing the output of the row address refresh signal 30a by the second NOR gate 313 according to the refresh command 100a, that is, preventing the execution of the refresh command 100a by the refresh signal generation unit 30. In this embodiment, each time the refresh command 100a is executed, the row address refresh signal 30a is outputted a number of times of a row number value; the refresh circuit is further configured to receive the process corner signal 10a to adjust the row number value, the faster a process corner represented by the process corner signal 10a, the greater the adjusted row number value.

The row number value is adjusted according to the process corner signal 10a, so that each refresh command 100a under a faster process corner corresponds to a larger number of refreshed rows and each refresh command 100a under a slower process corner corresponds to a smaller number of refreshed rows. In a case where a time interval between adjacent refresh commands 100a remains unchanged, under the faster process corner, a larger number of rows are refreshed under each refresh command 100a within a shorter data hold time, which helps ensure completion of refresh of all row addresses; under the slower process corner, a smaller number of rows are refreshed under each refresh command 100a within a longer data hold time, which helps prevent repeated refresh caused by early completion of refresh of all row addresses, so as to reduce the waste of refresh currents and reduce a refresh current corresponding to each refresh command 100a.

Specifically, the refresh control module 200 includes: a control unit 40 configured to receive the row address refresh signal 30a and output a refresh reset signal 40a, and further configured to count the row address refresh signal 30a to acquire a second count value and output the refresh reset signal 40a when the second count value is equal to the adjusted row number value; and a refresh signal generation unit 30 configured to receive the refresh reset signal 40a and the single-row refresh end signal 60a and output the row address refresh signal 30a; detect the refresh reset signal 40a when receiving the single-row refresh end signal 60a, output the row address refresh signal 30a if not receiving the refresh reset signal 40a, and suspend outputting the row address refresh signal 30a if receiving the refresh reset signal 40a.

Further, the control unit 40 includes: a second counting unit 41 configured to receive the row address refresh signal 30a, count the received row address refresh signal 30a, and output the second count value 41a; a second regulating unit 42 configured to receive the process corner signal 10a and the second count value 41a and output an excitation signal 42a; and configured to adjust the row number value according to the process corner signal 10a, and output the excitation signal 42a when the second count value 41a is equal to the adjusted row number value; and a second pulse generator 43 configured to receive the excitation signal 42a and output the refresh reset signal 40a.

Figure 2:
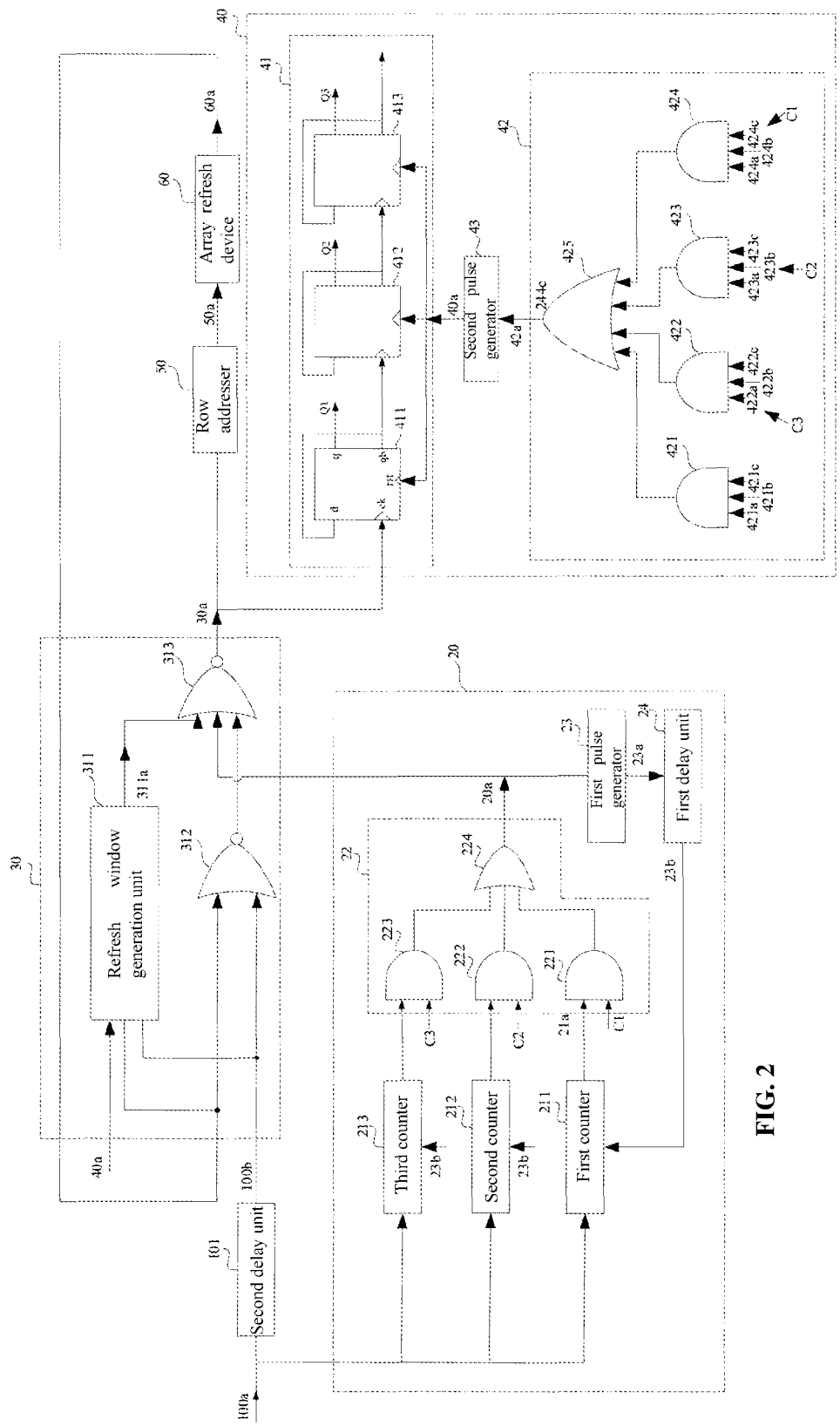

Referring to FIG. 1 and FIG. 2, in this embodiment, the second counting unit 41 includes an asynchronous binary addition counter composed of a plurality of D flip-flops connected in series, and the second regulating unit 42 includes a second OR gate 425 and a plurality of AND gates. The AND gate has at least one input terminal connected to an input terminal of the asynchronous binary addition counter and an output terminal connected to an input terminal of the OR gate 425. An output terminal of the second OR gate 425 acts as an output terminal of the second regulating unit 42. All input terminals of at least one AND gate are connected to a counting terminal of the asynchronous binary addition counter. When a level of the counting terminal represents a default value, the at least one AND gate outputs a high level. When one input terminal of at least another AND gate receives the process corner signal 10a and the level of the counting terminal represents a first value, the at least another AND gate outputs a high level. The first value is less than the default value.

A number of the D flip-flops forming the asynchronous binary addition counter is related to a maximum number of refreshed rows corresponding to a single refresh command 100a. The larger the maximum number of refreshed rows, the greater the number of the D flip-flops; the smaller the maximum number of refreshed rows, the smaller the number of the D flip-flops. Specifically, a maximum count value of n D flip-flops is $2n-1$, and the maximum count value is required to be greater than or equal to the maximum number of refreshed rows. For example, when the maximum number of refreshed rows is 7, the number of the D flip-flops is at least 3.

The D flip-flop has a data input terminal d, a clock input terminal ck, a first data output terminal q, a second data output terminal qb and a reset terminal rst. The first data output terminal q is complementary to the second data output terminal qb. A working principle and a connection manner of the asynchronous binary addition counter are described in detail below by taking 3 D flip-flops as an example.

The asynchronous binary addition counter (hereinafter referred to as "counter") includes a first D flip-flop 411 as a low order, a second D flip-flop 412 as a next high order, and a third D flip-flop 413 as a high order. The second data output terminal qb of each D flip-flop is connected to the data input terminal d and is connected to the clock input terminal ck of a next-stage D flip-flop. The first data output terminal q of each D flip-flop acts as a counting terminal. The reset terminal rst resets the level after the refresh reset signal 40a is received, which represents 0. The clock input terminal ck of the first D flip-flop 411 is configured to receive the row address refresh signal 30a, and the first D flip-flop 411 has a first counting terminal Q1. The second D flip-flop 412 has a second counting terminal Q2. The third D flip-flop 413 has a third counting terminal Q3.

When the D flip-flop represents 1, the corresponding counting terminal is at a high level. When data recorded by a relatively-low-order D flip-flop reaches 2, the relatively-low-order D flip-flop is required to be carried to a next-stage relatively-high-order D flip-flop. In this case, the relatively-low-order D flip-flop is reset, representing 0, and the relatively-high-order D flip-flop is carried, representing 1, which forms "carry 1 to a higher bit when the low bit reaches 2" in binary.

Specifically, the counter is in an initial state when not receiving a first row address refresh signal 30a, and the count value Q3Q2Q1=000. Each time one row address refresh signal 30a is received, the count value is increased once; that is, the count value Q3Q2Q1 is increased according to an order of 000, 001, 010, 011, 100, 101, 110 and 111. The count value Q3Q2Q1, when converted to decimal, represents 0, 1, 2, 3, 4, 5, 6 and 7 respectively. After the counter receives the refresh reset signal 40a, the count value Q3Q2Q1 is reset to the initial state of 000.

In addition, a number of the AND gate is related to a number of the received process corner signal 10a. Different process corner signals 10a represent different process corners, and row number values of the refreshed rows adjusted by the second regulating unit 42 according to the process corner signals 10a are also different; therefore, n process corner signals 10a correspond to n adjusted row number values. In this embodiment, each adjusted row number value corresponds to one AND gate, and n process corner signals require n+1 AND gates. At least two AND gates are provided.

In this embodiment, a number of input terminals of the AND gate is less than or equal to a number of the D flip-flops in the second counting unit 41. Since the number of the D flip-flops determines a maximum count value of the second counting unit 41, an optional range of row number values under different processor corners may be expanded by increasing the number of the D flip-flops, so as to refresh all row addresses in time under different processor corners and reduce the waste of refresh currents.

A structure of the second regulating unit 42 and a connection relationship between the second regulating unit 42 and the second counting unit 41 are illustrated below with a specific example. In the specific example, the second regulating unit 42 is configured to receive a first process corner signal C1, a second process corner signal C2 and a third process corner signal C3. An SS process corner represented by the first process corner signal C1 is slower than a TT process corner represented by the second process corner signal C2, and the TT process corner represented by the second process corner signal C2 is slower than an FF process corner represented by the third process corner signal C3.

Correspondingly, when the second regulating unit 42 does not receive the process corner signal 10a, the number of refreshed rows corresponding to each refresh command 100a is a default value, that is, 7. When the second regulating unit 42 receives the third process corner signal C3, the number of refreshed rows corresponding to each refresh command 100a is 6. When the second regulating unit 42 receives the second process corner signal C2, the number of refreshed rows corresponding to each refresh command 100a is 5. When the second regulating unit 42 receives the first process corner signal C1, the number of refreshed rows corresponding to each refresh command 100a is 3.

In order to realize the above specific example, the second regulating unit 42 according to the embodiment of the present application includes four AND gates. A number of input terminals of the AND gates is equal to the number of the D flip-flops. Specifically, The second regulating unit 42 includes a first AND gate 421, a second AND gate 422, a third AND gate 423, a fourth AND gate 424 and an OR gate 425. The first AND gate 421 has a first input terminal 421a connected to the first counting terminal Q1, a second input terminal 421b connected to the second counting terminal Q2, and a third input terminal 421c connected to the third counting terminal Q3. The second AND gate 422 has a first input terminal 422a configured to receive the third process corner signal C3, a second input terminal 422b connected to the second counting terminal Q2, and a third input terminal 422c connected to the third counting terminal Q3. The third AND gate 423 has a first input terminal 423a connected to the first counting terminal Q1, a second input terminal 423b configured to receive the second process corner signal C2, and a third input terminal 423c connected to the third counting terminal Q3. The fourth AND gate 424 has a first input terminal 424a connected to the first counting terminal Q1, a second input terminal 424b connected to the second counting terminal Q2, and a third input terminal 424c configured to receive the first process corner signal C1.

When the second regulating unit 42 does not receive the process corner signal 10a, the first input terminal 422a of the second AND gate 422, the second input terminal 423b of the third AND gate 423 and the third input terminal 424c of the fourth AND gate 424 are always at a low level, and output terminals of the second AND gate 422, the third AND gate 423 and the fourth AND gate 424 are always at a low level. In this case, only the first counting terminal Q1, the second counting terminal Q2 and the third counting terminal Q3 are all at a high level. That is, when the second count value 41a of the second counting unit 41 is 7, the first input terminal 421a, the second input terminal 421b and the third input terminal 421c of the first AND gate 421 can all receive high levels, the first AND gate 421 can output a high-level signal, and the OR gate 425 can output a high-level signal, which acts as the excitation signal 42a of the second pulse generator 43. The second pulse generator 43 generates the refresh reset signal 40a after receiving the excitation signal 42a. The refresh reset signal 40a, on the one hand, enables the counter to be restored to the initial state, that is, Q3Q2Q1=000; on the other hand, enables the refresh signal generation unit 30 to suspend outputting the row address refresh signal 30*a*.

Correspondingly, when the second regulating unit 42 receives the third process corner signal C3, the first input terminal 422*a* of the second AND gate 422 is at a high level. In this case, when the second counting terminal Q2 and the third counting terminal Q3 are both at a high level, that is, the second count value 41*a* of the second counting unit 41 is 6, the second AND gate 422 can output a high-level signal to enable the OR gate 425 to send an active-high excitation signal 42*a* to the second pulse generator 43.

Similarly, when the second input terminal 423*b* of the third AND gate 423 receives the second process corner signal C2 and the first counting terminal Q1 and the third counting terminal Q3 are both at a high level, that is, the second count value 41*a* of the second counting unit 41 is 5, the OR gate 425 sends the excitation signal 42*a* to the second pulse generator 43. When the third input terminal 424*c* of the fourth AND gate 424 receives the first process corner signal C1 and the first counting terminal Q1 and the second counting terminal Q2 are both at a high level, that is, the second count value 41*a* of the second counting unit 41 is 3, the OR gate 425 sends the excitation signal 42*a* to the second pulse generator 43.

In general, the second counting unit 41 counts the row address refresh signal 30*a*. After the count value reaches the row number value corresponding to the process corner signal 10*a*, the second pulse generator 43 generates the refresh reset signal 40*a*, so that the refresh signal generation unit 30 suspends outputting the row address refresh signal 30*a*. The slower the process corner, the smaller the row number value; therefore, with the slowdown of the process corner, fewer row address refresh signals 30*a* are outputted under each refresh command 100*a*, and a single refresh command 100*a* corresponds to a smaller number of refreshed rows. This can reduce a total number of refreshed rows within a relatively long data hold time and reduce the waste of refresh currents.

In this embodiment, the refresh signal generation unit 30 includes: a first NOR gate 312 configured to receive the refresh command 100*a* and the single-row refresh end signal 60*a*; a refresh window generation unit 311 configured to receive the refresh command 100*a*, the single-row refresh end signal 60*a* and the refresh reset signal 40*a*, and output a refresh window signal 311*a*; output the refresh window signal 311*a* when receiving the refresh command 100*a*; and configured to detect the refresh reset signal 40*a* when receiving the single-row refresh end signal 60*a*, continuously output the refresh window signal 311*a* if not receiving the refresh reset signal 40*a*, and suspend outputting the refresh window signal 311*a* if receiving the refresh reset signal 40*a*; and a second NOR gate 313 configured to receive an output signal of the first NOR gate 312, the shielding signal 20*a* and the refresh window signal 311*a*, and output the row address refresh signal 30*a*.

The refresh window signal 311*a* is an active-low window signal. A duration of the refresh window signal 311*a* is configured to represent a duration corresponding to each refresh command 100*a* during which the row address refresh signal 30*a* can be sent.

In this embodiment, the refresh circuit further includes: a switch unit 70 configured to receive the process corner signal 10*a* outputted by the process corner monitor 10, and send the process corner signal 10*a* to at least one of the shielding unit 20 and the control unit 40 after receiving the process corner signal 10*a*. In this way, the shielding unit 20 may be started through the switch unit 70 to adjust the execution proportion of the refresh command 100*a*, and/or the control unit 40 is started to adjust the number of refreshed rows under each refresh command 100*a*. When only the shielding unit 20 is enabled, the number of refreshed rows under each refresh command 100*a* is a default value, that is, 7. When only the control unit 40 is enabled, the refresh signal generation unit 30 receives and executes each refresh command 100*a*.

In other embodiments, the switch unit is configured only to control ON and OFF of the process corner monitor and the shielding unit and control ON and OFF of the process corner monitor and the control unit, but does not receive the process corner signal.

Figure 4:
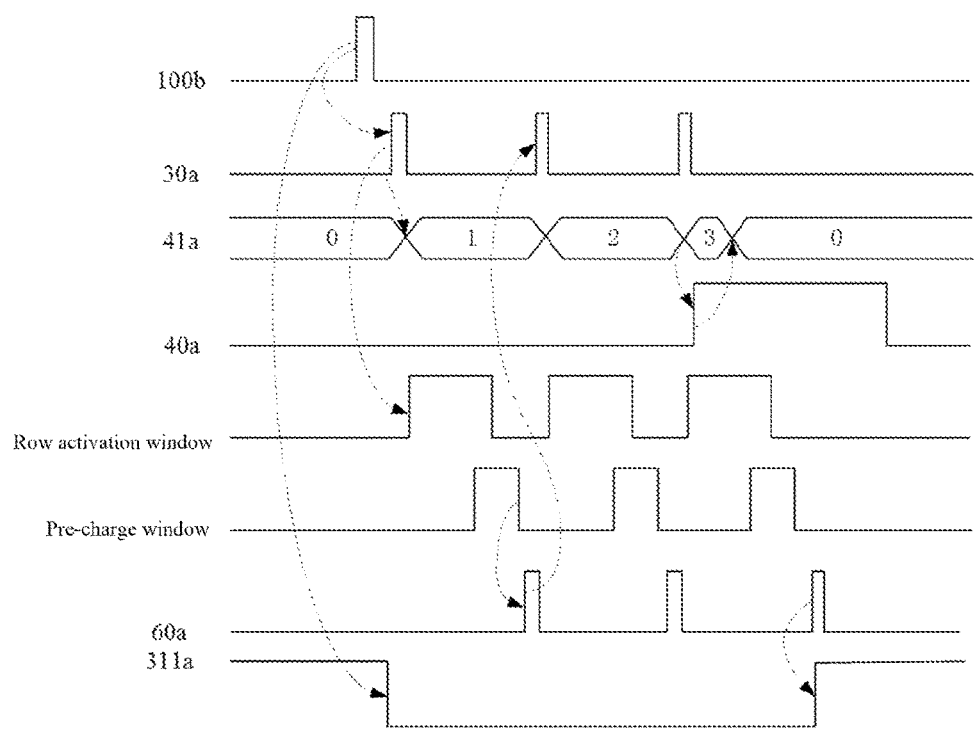

A partial operation principle of the refresh circuit is described below with reference to the timing diagram of signal generation of the refresh circuit provided in FIG. 4 with an example in which the second regulating unit 42 receives the first process corner signal C1, and the adjusted row number value is 3. Specifically, First signal generation process: The delayed refresh command 100*b* is an active-high pulse signal, and when the delayed refresh command 100*b* is received, an output terminal of the first NOR gate 312 changes to a low level. At the same time, the refresh window generation unit 311 outputs an active-low window signal 311*a*, the second NOR gate 313 does not receive the shielding signal 20*a*, and an output terminal of the second NOR gate 313 changes to a high level; that is, the refresh signal generation unit 30 outputs an active-high row address refresh signal 30*a*.

Second signal generation process: The row addresser 50 and the second counting unit 41 receive the row address refresh signal 30*a*. The second count value 41*a* outputted by the second counting unit 41 is 1. The row addresser 50 sends a first to-be-refreshed single-row address 50*a* to the array refresh device 60. The array refresh device 60 performs a single-row refresh operation according to the single-row address 50*a*.

The refresh operation includes a row activation window and a pre-charge window. The row activation window is an active-high window signal. The appearance of the row activation window represents the start of the single-row refresh operation. A duration of the row activation window is required to be greater than a row addressing time, so as to ensure effective completion of row addressing. The pre-charge window is an active-high window signal. The end of the pre-charge window represents the end of the single-row refresh operation. A duration of the pre-charge window is required to be greater than a pre-charge time, so as to ensure effective completion of pre-charge.

Third signal generation process: The array refresh device 60 outputs the single-row refresh end signal 60*a* after completing the single-row refresh operation on the single-row address 50*a*. The refresh window generation unit 311 detects the refresh reset signal 40*a* after receiving the single-row refresh end signal 60*a*. The second count value 41*a* is 1 and has not reached 3 in this case; therefore, the refresh reset signal 40*a* has not yet been sent, and the refresh window generation unit 311 continuously outputs an active-low refresh window signal 311*a*. At the same time, since the single-row refresh end signal 60*a* is an active-high pulse signal, the first NOR gate 312 outputs a low level when receiving the single-row refresh end signal 60*a*. In this way, the second NOR gate 313 can output a second row address refresh signal 30a, and the second signal generation process is repeated; in this case, the second count value 41a changes from 1 to 2.

Fourth signal generation process: After the refresh signal generation unit 30 outputs a third row address refresh signal 30a, the second count value 41a changes from 2 to 3, the three input terminals of the fourth AND gate 424 are all at a high level, the fourth AND gate 424 outputs a high level, and the second OR gate 425 outputs the excitation signal 42a. The second pulse generator 43 generates the refresh reset signal 40a under the excitation of the excitation signal 42a. The reset terminal rst of each D flip-flop receives the refresh reset signal 40a, and the level is reset to a low level, representing a value of 0. In this case, the second count value 41a is reset from 3 to 0, and next count is waited. At the same time, the refresh window generation unit 311 receives the refresh reset signal 40a.

Fifth signal generation process: the array refresh device 60 outputs a third single-row refresh end signal 60a after completing a single-row refresh action according to the single-row address 50a corresponding to the third row address refresh signal 30a. The refresh window generation unit 311 detects the refresh reset signal 40a after receiving the single-row refresh end signal 60a. The second pulse generator 43 has sent the refresh reset signal 40a in this case; therefore, the refresh window signal 311a of the refresh window generation unit 311 is suspended, the output terminal of the refresh window generation unit 311 changes from a low level to a high level, and the output terminal of the second NOR gate 313 changes to a low level; that is, the output of the row address refresh signal 30a is suspended, so that the number of refreshed rows corresponding to each refresh command 100a is 3.

It is to be noted that the duration of the refresh reset signal 40a outputted by the second pulse generator 43 should be greater than a row addressing time of the row addresser 50 and a single-row refresh time of the array refresh device 60, which ensures that the refresh reset signal 40a continues when the refresh window generation unit 311 receives the third single-row refresh end signal 60a, so as to effectively suspend the output of the row address refresh signal 30a.

Only one refresh command 100a is taken as an example in the above timing diagram. The refresh window generation unit 311 may output the refresh window signal 311a again when receiving the delayed refresh command 100b again. The refresh circuit repeats the above signal generation processes.

In this embodiment, the execution proportion of the refresh command is adjusted according to the process corner represented by the process corner signal, so that the execution proportion of the refresh command is higher under a faster process corner, and the execution proportion of the refresh command is lower under a slower process corner. In a case where a time interval between adjacent refresh commands remains unchanged, under the faster process corner, the execution proportion of the refresh command is higher within a shorter data hold time, which helps ensure completion of refresh of all row addresses; under the slower process corner, the execution proportion of the refresh command is lower within a longer data hold time, which helps prevent repeated refresh caused by early completion of refresh of all row addresses, so as to reduce the waste of refresh currents. Correspondingly, an embodiment of the present application further provides a memory, including the refresh circuit according to any one of the above items. This helps reduce a current waste during the refresh of the memory.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A refresh circuit, comprising:
   a refresh control module configured to receive and execute a refresh command to output a row address refresh signal; and further configured to receive a process corner signal to adjust an execution proportion of the refresh command, the faster a process corner represented by the process corner signal, the higher the adjusted execution proportion;
   a row addresser configured to receive the row address refresh signal and output a to-be-refreshed single-row address; and
   an array refresh device configured to perform a single-row refresh operation according to the to-be-refreshed single-row address and output a single-row refresh end signal after an end of single-row refresh operation,
   wherein the refresh control module comprises:
      a shielding unit configured to receive the refresh command and the process corner signal, count the refresh command to acquire a first count value, and output a shielding signal when the first count value is equal to a shielding value, the shielding signal being configured to shield the refresh command; and
      a refresh signal generation unit configured to receive the shielding signal and the refresh command, output the row address refresh signal when receiving the refresh command but not receiving the shielding signal, and suspend outputting the row address refresh signal when receiving the shielding signal.

2. The refresh circuit according to claim 1, wherein the shielding unit comprises:
   a first regulating unit configured to receive a marking signal and the process corner signal, determine the shielding value according to the process corner signal, and output the shielding signal when receiving the marking signal and the process corner signal at the same time; and
   a first counting unit configured to receive the refresh command and count the received refresh command, and output the marking signal when the first count value is equal to the shielding value; and further configured to receive a shielding reset signal, reset the first count value when receiving the shielding reset signal, and suspend outputting the marking signal.

3. The refresh circuit according to claim 2, wherein the first counting unit comprises a first counter and a second counter, a shielding value of the first counter being less than that of the second counter; and the first regulating unit comprises an OR gate, a first AND gate and a second AND gate, an input terminal of the OR gate being connected to output terminals of the first AND gate and the second AND gate, and an output terminal of the OR gate acting as an output terminal of the first regulating unit; and
   the first AND gate is configured to receive the marking signal outputted by the first counter, and configured to receive a first process corner signal; the second AND gate is configured to receive the marking signal outputted by the second counter, and configured to receive a second process corner signal, a process corner represented by the second process corner signal being faster than that represented by the first process corner signal.

4. The refresh circuit according to claim 3, wherein the first counting unit further comprises: a third counter, a shielding value of the third counter being greater than that of the second counter; and the first regulating unit further comprises: a third AND gate, the third AND gate being configured to receive the marking signal outputted by the third counter, and configured to receive a third process corner signal, a process corner represented by the third process corner signal being faster than that represented by the second process corner signal, and an output terminal of the third AND gate being connected to the input terminal of the OR gate.

5. The refresh circuit according to claim 2, wherein the shielding unit further comprises:
    a first pulse generator configured to receive the shielding signal and output the shielding reset signal; and
    a first delay unit configured to delay the shielding reset signal, a delay time being greater than one clock cycle.

6. The refresh circuit according to claim 2, further comprising: a second delay unit configured to match delays of the first counting unit and the first regulating unit to enable the shielding signal to reach the refresh signal generation unit earlier than the refresh command.

7. The refresh circuit according to claim 1, wherein each time the refresh command is executed, the row address refresh signal is outputted a number of times of a row number value; the refresh control module further comprises: a control unit configured to receive the process corner signal to adjust the row number value, the faster a process corner represented by the process corner signal, the greater the adjusted row number value.

8. The refresh circuit according to claim 7, wherein the control unit is configured to receive the row address refresh signal, count the row address refresh signal to acquire a second count value and output a refresh reset signal when the second count value is equal to the adjusted row number value; and
    the refresh signal generation unit is further configured to receive the refresh reset signal and the single-row refresh end signal, detect the refresh reset signal when receiving the single-row refresh end signal, output the row address refresh signal when-if not receiving the refresh reset signal, and suspend outputting the row address refresh signal when receiving the refresh reset signal.

9. The refresh circuit according to claim 8, wherein the control unit comprises:
    a second counting unit configured to receive the row address refresh signal, count the received row address refresh signal, and output the second count value;
    a second regulating unit configured to receive the process corner signal and the second count value, adjust the row number value according to the process corner signal, and output an excitation signal when the second count value is equal to the adjusted row number value; and
    a second pulse generator configured to receive the excitation signal and output the refresh reset signal.

10. The refresh circuit according to claim 8, wherein the refresh signal generation unit comprises:
    a first NOR gate configured to receive the refresh command and the single-row refresh end signal;
    a refresh window generation unit configured to receive the refresh command, the single-row refresh end signal and the refresh reset signal, and output a refresh window signal when receiving the refresh command; and
    configured to detect the refresh reset signal when receiving the single-row refresh end signal, output the refresh window signal when-if not receiving the refresh reset signal, and suspend outputting the refresh window signal when-if receiving the refresh reset signal; and
    a second NOR gate configured to receive an output signal of the first NOR gate, the shielding signal and the refresh window signal, and output the row address refresh signal.

11. The refresh circuit according to claim 10, wherein the refresh command and the single-row refresh end signal are active-high pulse signals, and the refresh window signal is an active-low window signal.

12. The refresh circuit according to claim 7, further comprising: a process corner monitor configured to monitor a process corner of a target chip, and output a specific process corner signal according to the process corner.

13. The refresh circuit according to claim 12, further comprising: a switch unit configured to receive the process corner signal outputted by the process corner monitor, and send the process corner signal to at least one of the shielding unit or the control unit after receiving the process corner signal.

14. A memory, comprising the refresh circuit according to claim 1.

* * * * *